US010190235B2

United States Patent
Ho et al.

(10) Patent No.: US 10,190,235 B2
(45) Date of Patent: Jan. 29, 2019

(54) WAFER SUPPORTING STRUCTURE AND METHOD FOR FORMING THE SAME

(71) Applicant: Taiwan Semiconductor Manufacturing Company, Ltd., Hsin-Chu (TW)

(72) Inventors: An-Li Ho, Hsin-Chu (TW); Chi-En Huang, Kaohsiung (TW); Yi Jia Chen, New Taipei (TW); Pu-Fang Chen, Hsin-Chu (TW); Cary Chia-Chung Lo, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 260 days.

(21) Appl. No.: 13/902,630

(22) Filed: May 24, 2013

(65) Prior Publication Data

US 2014/0349466 A1 Nov. 27, 2014

(51) Int. Cl.

| | | |
|---|---|---|
| *B65D 85/00* | (2006.01) | |
| *C30B 33/00* | (2006.01) | |
| *C30B 29/06* | (2006.01) | |
| *H01L 21/677* | (2006.01) | |
| *C30B 13/00* | (2006.01) | |

(52) U.S. Cl.

CPC .............. *C30B 33/00* (2013.01); *C30B 29/06* (2013.01); *H01L 21/67706* (2013.01); *H01L 21/67709* (2013.01); *C30B 13/00* (2013.01); *Y10T 117/1076* (2015.01)

(58) Field of Classification Search

CPC ......... H01L 21/67369; H01L 21/67386; H01L 21/67373; H01L 21/67383; H01L 21/67346

USPC ................ 206/455, 456, 701, 710, 711–712; 221/41.18

See application file for complete search history.

(56) References Cited

U.S. PATENT DOCUMENTS

| | | | | |
|---|---|---|---|---|
| 5,951,753 | A * | 9/1999 | Dornberger | ............. C30B 15/14 117/217 |
| 6,099,302 | A * | 8/2000 | Hong et al. | .................... 432/259 |
| 6,796,439 | B2 * | 9/2004 | Araki | ....................... C30B 31/14 211/41.18 |
| 7,033,168 | B1 * | 4/2006 | Gupta et al. | ................... 432/253 |
| 7,073,999 | B2 * | 7/2006 | Oyama | ............. H01L 21/67369 206/454 |
| 7,121,414 | B2 * | 10/2006 | Beckhart | ........... H01L 21/67383 211/41.18 |
| 7,157,376 | B1 * | 1/2007 | Foong | ............... H01L 21/02008 257/E21.218 |
| 8,919,563 | B2 * | 12/2014 | Gregerson | ........ H01L 21/67383 206/710 |
| 2004/0083945 | A1 * | 5/2004 | Iino et al. | ........................ 117/13 |
| 2007/0298621 | A1 * | 12/2007 | Anbai et al. | .................. 438/764 |

(Continued)

*Primary Examiner* — Anthony Stashick
*Assistant Examiner* — Kaushikkumar Desai
(74) *Attorney, Agent, or Firm* — Slater Matsil, LLP (57) ABSTRACT

A method for forming a wafer supporting structure comprises growing a single crystal using a floating zone crystal growth process, forming a silicon ingot having an oxygen concentration equal to or less than 1 parts-per-million-atomic (ppma), slicing a wafer from the silicon ingot, cutting portions of the wafer to form a supporting structure through a mechanical lathe and applying a high temperature anneal process to the supporting structure.

20 Claims, 5 Drawing Sheets

(56) References Cited

U.S. PATENT DOCUMENTS

| | | | |
|---|---|---|---|
| 2009/0203229 A1* | 8/2009 | Ishiguro | H01L 21/67309 438/795 |
| 2010/0273310 A1* | 10/2010 | Hanaoka | H01L 21/76254 438/458 |
| 2011/0269316 A1* | 11/2011 | Gilmore | 438/795 |
| 2012/0063206 A1* | 3/2012 | Furutani | G11C 11/404 365/149 |
| 2012/0077138 A1* | 3/2012 | Gilmore et al. | 432/253 |
| 2012/0260989 A1* | 10/2012 | DeLuca | 136/261 |

* cited by examiner

WAFER SUPPORTING STRUCTURE AND METHOD FOR FORMING THE SAME

BACKGROUND

Semiconductor devices are fabricated on silicon wafers. The silicon wafers may be sliced from a single-crystal silicon ingot. The single-crystal silicon ingot may be grown by using suitable crystal growth techniques. The crystal growth techniques may be divided into two categories, namely the Czochralski crystal growth method and the floating zone crystal growth method.

The Czochralski crystal growth method comprises separating metallurgical grade silicon (MGS) from silicon dioxide ($SiO_2$) through the reaction between $SiO_2$ and carbon (C), refining MGS to yield semiconductor grade silicon (SGS), heating the silicon to the melting point of silicon (1412 degrees), melting silicon to form liquid silicon in a Czochralski silicon puller, inserting a seed crystal into the liquid silicon, raising the seed crystal slowly from the liquid silicon so as to allow a single-crystal layer to grow on the seed crystal.

The Czochralski crystal growth process may include several stages such as a neck region growth stage, a shoulder region growth stage, a body growth stage and a tail region growth stage. At the end of the crystal growth process, a single-crystal ingot is pulled from the Czochralski silicon puller.

The floating zone crystal growth method comprises clamping a polycrystalline silicon rod with one end in contact with a single-crystal seed layer, placing a radio frequency (RF) heating coil surrounding a lower portion of the polycrystalline silicon rod, heating the lower portion of the polycrystalline silicon rod beyond the melting point of silicon through eddy currents induced by the RF heating coil, forming a melt zone between the single-crystal seed layer and the upper portion of the polycrystalline silicon rod, solidifying the melt zone on the single-crystal seed layer to form a single-crystal having the same crystalline direction as the single-crystal seed layer.

One advantage of having the floating zone crystal growth method is that the silicon growth process does not require a container. As a result, the floating zone crystal growth method helps to prevent contamination and improve the purity of the single-crystal ingot.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a method for fabricating a c-shaped ring, wherein the c-shaped ring is employed to support a semiconductor wafer. The invention may also be applied, however, to a variety of semiconductor supporting structures. Hereinafter, various embodiments will be explained in detail with reference to the accompanying drawings.

Figure 1:
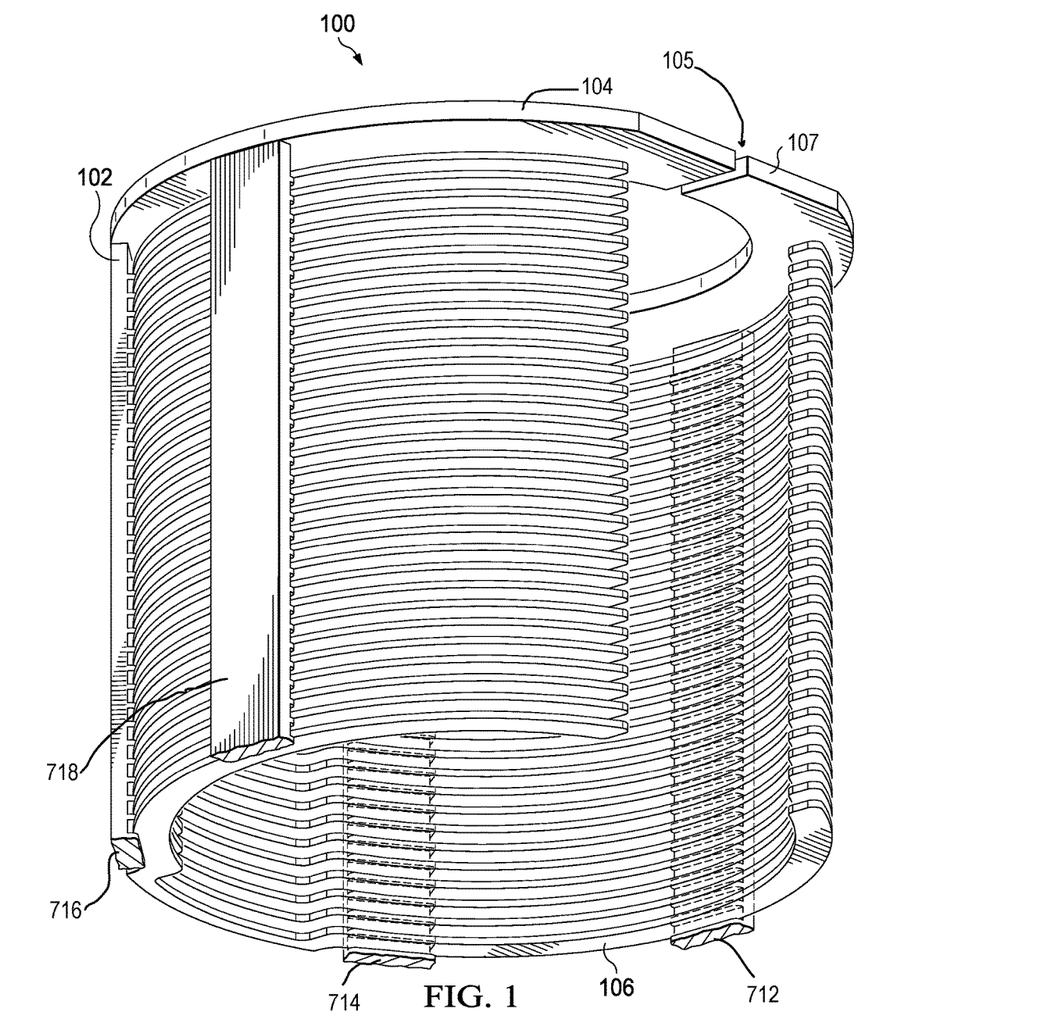
FIG. 1 illustrates a perspective view of a wafer boat in accordance with various embodiments of the present application.

FIG. 1 illustrates a perspective view of a wafer boat in accordance with various embodiments of the present application. The wafer boat 100 may be placed in a semiconductor fabrication chamber for various fabrication processes such as chemical vapor deposition (CVD), thermal oxidation, heating and/or the like. In some embodiments, the wafer boat 100 may be formed of suitable materials such as quartz and/or the like.

The wafer boat 100 may comprise a plurality of columns such as column 102. In some embodiments, the wafer boat 100 may comprise four columns. The columns are fixed to a top plate 104 and a bottom plate (not shown) of the wafer boat 100. On each column, there may be a plurality of grooves vertically spaced apart from each other. The detailed structure of the grooves will be described below with respect to FIG. 2. As shown in FIG. 1, top plate 104 has a gap 105 positioned between two of the columns. The top plate gap 105 is a split in the top plate 104 such that the top plate 104 is discontinuous. Also as shown in FIG. 1, the top plate 104 has a circular shape with an edge portion 107 having an apparent flat side surface positioned between two of the columns. The top plate gap 105 may be disposed as a split through the flat side surface edge portion 107 of the top plate 104.

A plurality of wafer supporting structures 106 may be inserted into their respective grooves so as to provide a supporting platform for a wafer to be transferred onto or from a corresponding wafer supporting structure 106.

In some embodiments, the wafer supporting structure 106 may be implemented as a c-shaped ring. Throughout the description, the wafer supporting structure 106 may be alternatively referred to as a c-shaped ring 106. The detailed description of the c-shaped ring 106 will be illustrated below with respect to FIG. 3-FIG. 7. As shown in FIG. 1, the opening of c-shaped ring 106 is aligned with the top plate gap 105 and flat side surface edge portion 107 of the top plate 104. Also as shown in FIG. 1, the top plate gap 105 and flat side surface edge portion 107 of the top plate 104 is aligned about midway between columns 712 and 718.

Figure 2:
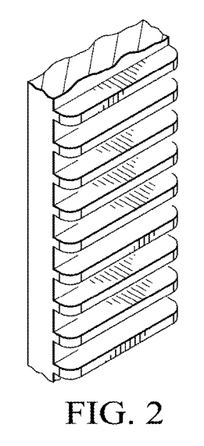
FIG. 2 illustrates a perspective view of the grooves of the wafer boat in accordance with various embodiments of the present application.

FIG. 2 illustrates a perspective view of the grooves of the wafer boat shown in FIG. 1 in accordance with various embodiments of the present application. Each column of the wafer boat 100 may comprise a plurality of grooves spaced apart from each other in a longitudinal direction. More particularly, the grooves may be evenly spaced as shown in FIG. 2. The spacing between two adjacent grooves provides enough clearance so that a wafer may be horizontally transferred into or out of two adjacent supporting structures (not shown).

Figure 3:
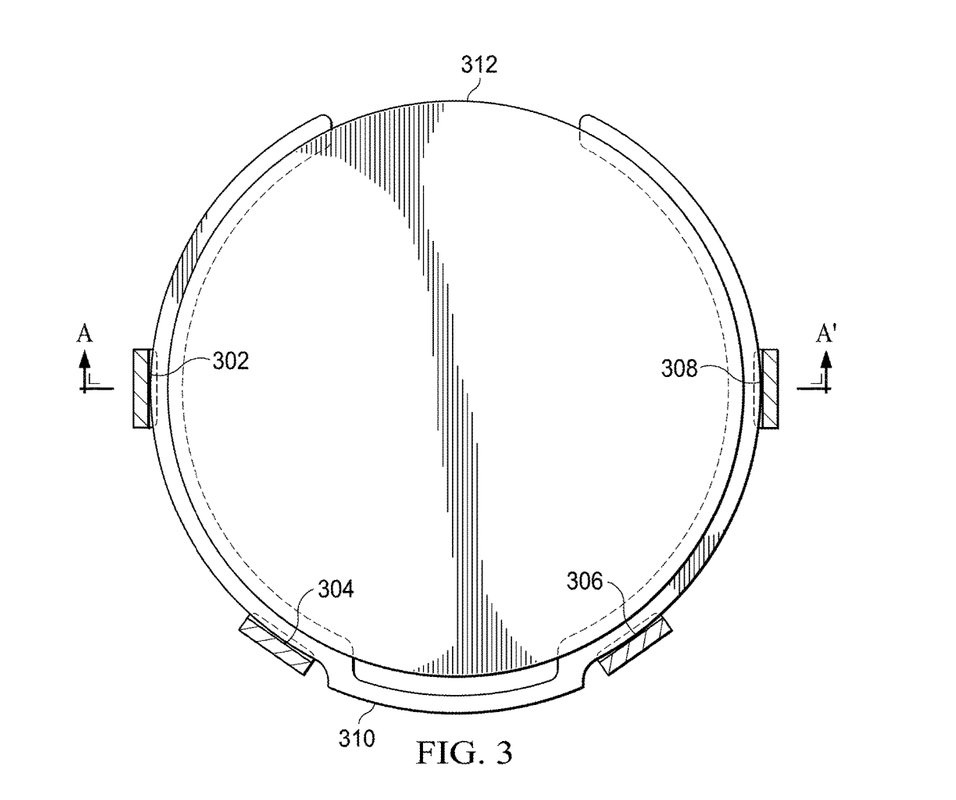
FIG. 3 illustrates a top view of a wafer on top of a c-shaped ring in accordance with various embodiments of the present application.

FIG. 3 illustrates a top view of a wafer on top of a c-shaped ring in accordance with various embodiments of the present application. In some embodiments, the wafer boat 100 may include four columns. At a particular height, there may be a groove at each column. As shown in FIG. 3, grooves 302, 304, 306 and 308 are located in different columns, but are of the same relative height from the bottom plate of the wafer boat 100.

It should be noted while FIG. 3 illustrate four columns, a person skilled in the art will recognize that the wafer boat 100 may accommodate any number of columns. The top view shown in FIG. 3 is merely an example. There may be many varieties, alternatives and modifications.

A c-shaped ring 310 is supported by grooves 302, 304, 306 and 308. The c-shaped ring 310 may be formed by cutting an inner portion and part of an edge portion of a round wafer. The cutting process may be carried out on a mechanical lathe process.

A wafer 312 is placed on top of the c-shaped ring 310. In some embodiments, the wafer 312 is of a diameter equal to about 300 mm. As shown in FIG. 3, the outer diameter of the c-shaped ring 310 is larger than the diameter of the wafer 312. On the other hand, the inner diameter of the c-shaped ring 310 is smaller than the diameter of the wafer 312.

Figure 4:
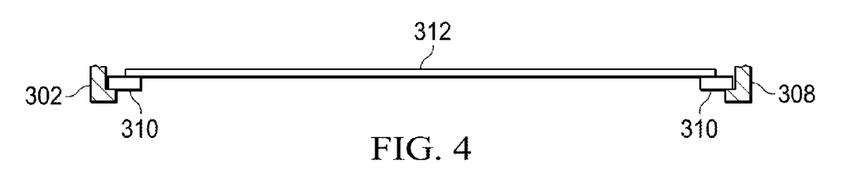
FIG. 4 illustrates a cross sectional view of a wafer on top of a c-shaped ring in accordance with various embodiments of the present application.

FIG. 4 illustrates a cross sectional view of a wafer on top of a c-shaped ring in accordance with various embodiments of the present application. The cross sectional view is taken along line A-A' shown in FIG. 3. As shown in FIG. 4, the c-shaped ring 310 is supported by the top surfaces of the grooves 302 and 308 respectively. The wafer 312 is placed on top of the c-shaped ring 310. More particularly, there may be a small horizontal gap between the outer edge of the wafer 312 and the outer edge of the c-shaped ring 310. Such a small horizontal gap helps to allow the wafer 312 to be horizontally transferred onto or from the wafer boat 100.

Figure 5:
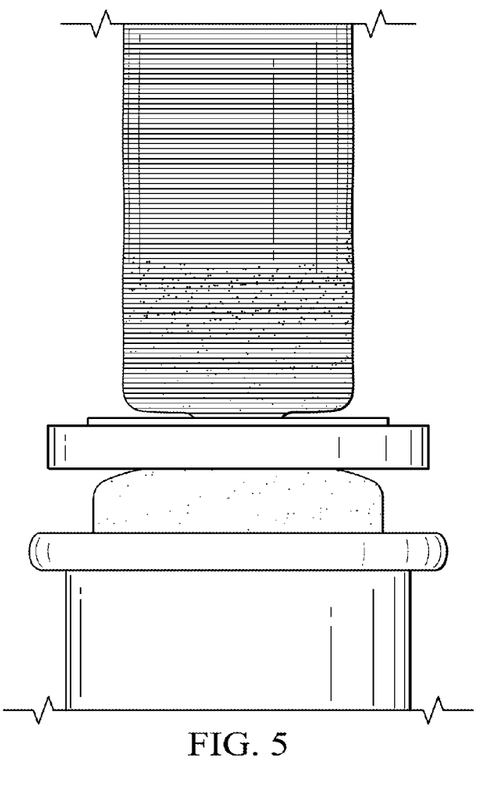
FIG. 5 illustrates a crystal growth process of a silicon ingot from which the c-shaped ring is fabricated in accordance with various embodiments of the present application.

FIG. 5 illustrates a crystal growth process of a silicon ingot from which the c-shaped ring is fabricated in accordance with various embodiments of the present application. The silicon ingot is fabricated through the floating zone crystal growth method. The detailed fabrication process of the floating zone crystal growth method is well known, and hence is not discussed herein to avoid repetition.

As shown in FIG. 5, the silicon ingot is grown from a floating zone without a container. Therefore, impurities such as oxygen are less in comparison with a silicon ingot formed by other crystal growth techniques such as the Czochralski crystal growth process and/or the like.

In some embodiments, the silicon ingot is of a diameter of 300 mm. By employing the floating zone crystal growth method, the oxygen content of the silicon ingot is about 0.2 parts-per-million-atomic (ppma). In contrast, the oxygen content of the silicon ingot fabricated by other methods such as the Czochralski crystal growth method is in a range from about 8 ppma to about 10 ppma.

One advantageous feature of having a lower oxygen content level in a silicon ingot is that the lower oxygen content may help to reduce the possibility of generating bulk micro defects (BMD) during the fabrication process of a supporting structure such as the c-shaped ring 310 shown in FIG. 3. Furthermore, a lower BMD may improve the mechanical strength of the c-shaped ring 310.

In some embodiments, the c-shaped ring 310 is of a higher mechanical strength. In addition, the c-shaped ring 310 may provide a better surface on which a larger semiconductor wafer is placed. In particular, for larger wafers such as a 450 mm wafer, a supporting structure formed by the floating zone crystal growth method described above may help to provide better planarity. Such better planarity helps to improve the quality of the manufacturing process and the reliability of the larger wafer (e.g., 450 mm wafers).

Figure 6:
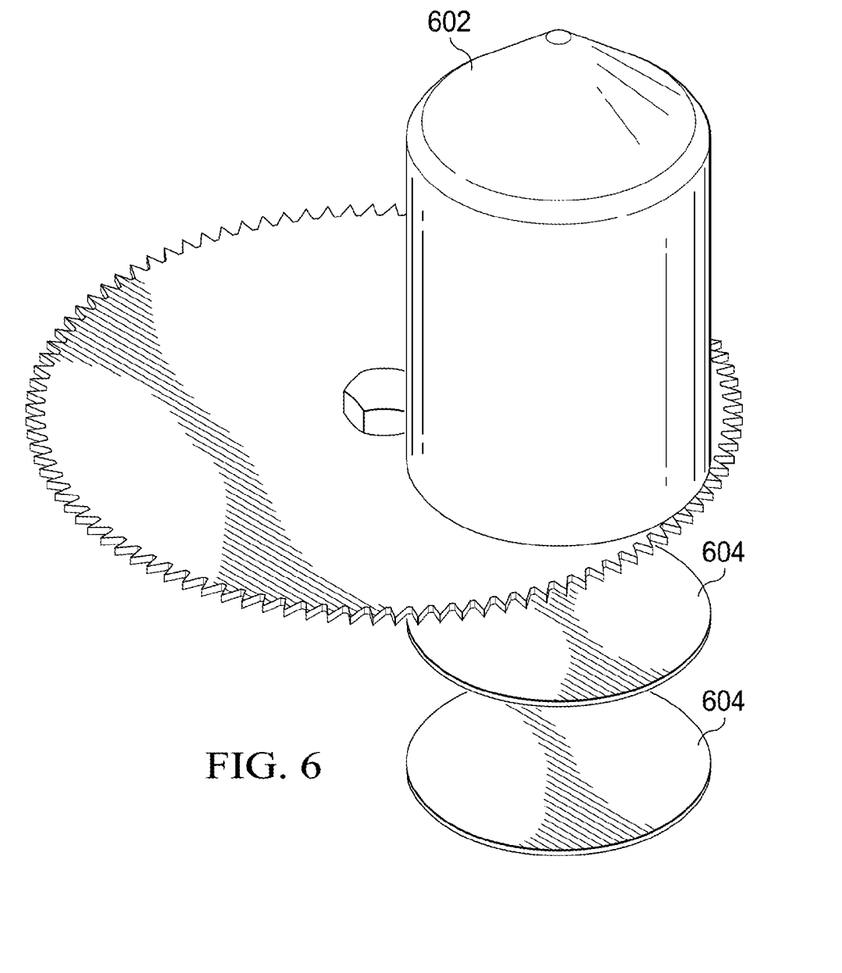
FIG. 6 illustrates a slicing process applied to the silicon ingot in accordance with various embodiments of the present application.

FIG. 6 illustrates a slicing process applied to the silicon ingot in accordance with various embodiments of the present application. The silicon ingot 602 is fabricated by the floating zone crystal growth method. As a result, the silicon ingot 602 is of a lower oxygen content level as well as few bulk micro defects. The silicon ingot 602 is sliced to produce a plurality of wafers 604 as shown in FIG. 6. The slicing process is well known in the art, and hence is not discussed herein.

Figure 7:
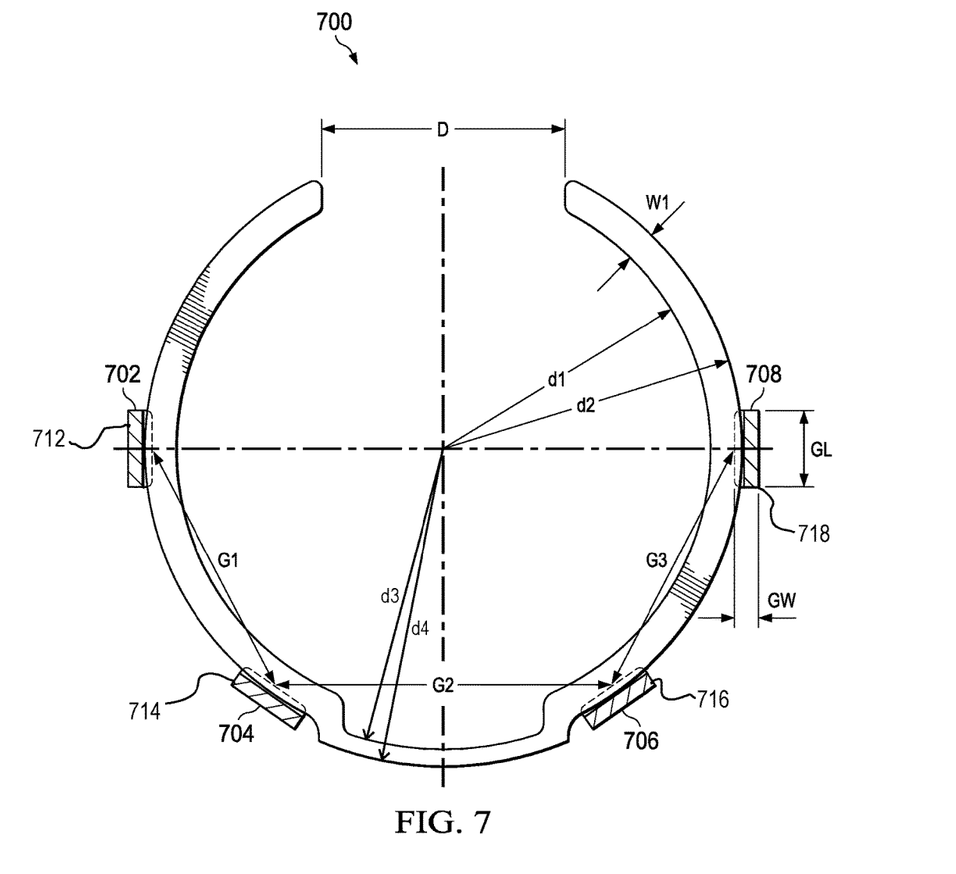
FIG. 7 illustrates a top view of a c-shaped ring after a lathe process and an anneal process are applied to the wafer shown in FIG. 6 in accordance with various embodiments of the present application.

FIG. 7 illustrates a top view of a c-shaped ring after a lathe process and an anneal process are applied to the wafer shown in FIG. 6 in accordance with various embodiments of the present application. The wafer 604 shown in FIG. 6 is of a circular shape. By using a suitable tool such as a mechanical lathe and/or the like, an inner portion as well as part of the edge portion of the wafer 604 may be removed so as to form a c-shaped ring 700 as shown in FIG. 7.

As shown in FIG. 7, the c-shaped ring 700 is of width W1. W1 is about 31 mm according to some embodiments. The inner radius of the c-shaped ring 700 is defined as d1. As shown in FIG. 7, d1 is slightly less than 150 mm for a total inner diameter slightly less than 300 mm. The outer radius of the c-shaped ring 700 is defined as d2. As shown in FIG. 7, d2 is slightly greater than 150 mm for a total outer diameter slightly greater than 300 mm. Furthermore, there is a gap between two terminals of the c-shaped ring 700. The gap is defined as D as shown in FIG. 7. In some embodiments, D is about 127.1 mm. The radius d3 is shown in FIG. 7 as being the inner radius of a tab portion of the c-shaped ring opposite to the gap. As illustrated in FIG. 7, the radius d3 may be about the same value as the radius d2. The tab portion also has an outer radius d4 which is larger than the radius d3 and larger than the radius d2.

The c-shaped ring 700 is placed on four grooves as shown in FIG. 7. The grooves are spaced apart along the bottom part of the c-shaped ring 700. The distance between the first groove 702 and the second groove 704 is defined as G1. The distance between the second groove 704 and the third groove 706 is defined as G2. The distance between the third groove 706 and the fourth groove 708 is defined as G3. As shown in FIG. 7, G1, G2 and G3 are approximately equal to each other. FIG. 7 illustrates four columns such as columns 102 of a wafer boat 100 (see FIG. 1). The first groove 702 is part of the first column 712, the second groove 704 is part of the second column 714, the second groove 706 is part of the second column 716, and the fourth groove 708 is part of the fourth column 718. As shown in FIG. 7, the distances G1, G2, and G3, described above, can also be seen as the lateral distances between the first and second columns, the second and third columns, and third and fourth columns, respectively. The distances G1, G2, and G3 can be seen as being measured from about the midpoint of each of the respective columns. The first column 712 and fourth column 718 can be positioned on diametrically opposed sides of the wafer boat 100.

FIG. 7 further illustrates the size of the groove (e.g., groove 708) according to some embodiments. As shown in FIG. 7, the length of the groove from a top view is defined as GL and the width of the groove is defined as GW. In according to some embodiments, GL is about 40 mm. GW is about 12 mm.

It should be noted that after a lathe process is applied to the wafer 604, an anneal process may be applied to the c-shaped ring 700 after the cutting process. The anneal process is of a temperature of about 1200 degrees.

In accordance with an embodiment, a device comprises a supporting structure configured to support a wafer in a wafer boat, wherein the supporting structure is of an oxygen content level equal to or less than 1 ppma and the wafer is of a wafer diameter equal to or greater than 300 mm.

In accordance with an embodiment, a method comprises growing a single crystal using a floating zone crystal growth process, forming a silicon ingot having an oxygen concentration equal to or less than 1 parts-per-million-atomic (ppma) and slicing a wafer from the silicon ingot.

The method further comprises cutting portions of the wafer to form a supporting structure through a mechanical lathe and applying a high temperature anneal process to the supporting structure.

In accordance with an embodiment, a system comprises a wafer boat comprising a plurality of columns, a plurality of grooves vertically spaced apart on at least one column, a supporting structure placed on a top surface of the groove, wherein the supporting structure is of an oxygen concentration less than or equal to 1 parts-per-million-atomic (ppma) and a wafer placed on the supporting structure.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
a wafer boat comprising at least a first column, a second column, a third column, and a fourth column fixed to a top plate and a bottom plate of the wafer boat, wherein a first lateral distance between the first column and second column, a second lateral distance between the second column and the third column, and a third lateral distance between the third column and the fourth column are equal; and
a supporting structure configured to support a wafer in the wafer boat, wherein:
the supporting structure is formed of silicon having an oxygen content level equal to or less than 1 parts-per-million-atomic (ppma) and the supporting structure is of a diameter greater than 300 mm, and wherein the supporting structure comprises a first portion having a first inner radius, a second portion having a second inner radius and a third portion having a third inner radius, and wherein:
the first portion is separated from the third portion by a first gap of the supporting structure,
the second portion joins the first portion to the third portion opposite the first gap,
the first inner radius is equal to the third inner radius, and
the second inner radius is greater than the first inner radius; and
wherein the wafer is of a wafer diameter equal to or greater than 300 mm, wherein the wafer is in direct contact with the supporting structure.

2. The device of claim 1, wherein:
the supporting structure is a c-shaped ring, and wherein the c-shaped ring comprises:
an outer diameter larger than the wafer diameter; and
an inner diameter smaller than the wafer diameter.

3. The device of claim 1, wherein:
the oxygen content level of the supporting structure is about 0.2 ppma.

4. The device of claim 1, wherein:
each of the first, second, third, and fourth columns comprises a plurality of grooves vertically spaced apart from each other to provide clearance for allowing the wafer to be transferred onto or from the supporting structure.

5. The device of claim 1, wherein:
the wafer diameter is approximately equal to 450 mm.

6. A system comprising:
a wafer boat comprising a plurality of columns affixed to a top plate;
a plurality of grooves vertically spaced apart on at least one column;
a supporting structure placed on a top surface of the groove, wherein the supporting structure is formed of silicon having an oxygen concentration less than or equal to 1 parts-per-million-atomic (ppma), and wherein the supporting structure is of a diameter greater than 300 mm, and wherein the supporting structure comprises a first portion having a first inner radius, a second portion having a second inner radius and a third portion having a third inner radius, and wherein:
a first contact point between the supporting structure and the wafer boat is at a midpoint of the first portion;
a second contact point and a third contact point between the supporting structure and the wafer boat are placed in a symmetrical manner with respect to the second portion;
a fourth contact point between the supporting structure and the wafer boat is at a midpoint of the third portion;
the first portion and the third portion are separated by a gap;
the second portion is between the first portion and the third portion;
the first inner radius is equal to the third inner radius; and the second inner radius is greater than the first inner radius; and a wafer placed on the top surface of the supporting structure, wherein the wafer is in direct contact with the supporting structure, wherein the top plate is circular and has a top plate gap formed in an edge portion thereof, wherein the edge portion has a flat side surface, wherein the top plate gap is aligned with the gap of the supporting structure, wherein the top plate gap is smaller than the gap of the supporting structure.

7. The system of claim 6, wherein:
the wafer boat comprises four columns, each of which comprises the plurality of grooves; and
the supporting structure is placed on the grooves from different columns, and wherein the grooves have a same height.

8. The system of claim 6, wherein:
the supporting structure is a c-shaped ring.

9. The system of claim 6, wherein:
the wafer is of a diameter equal to about 300 mm.

10. The system of claim 9, wherein:
the supporting structure includes an inner diameter and an outer diameter, and wherein:
the inner diameter is less than 300 mm; and
the outer diameter is greater than 300 mm.

11. The system of claim 6, wherein:
the wafer boat is formed of quartz.

12. A device comprising:
a wafer boat comprising at least four columns including a first column, a second column, a third column, and a fourth column, wherein the at least four columns have grooves formed therein, wherein the at least four columns are fixed to a top plate and a bottom plate of the wafer boat, wherein a midpoint of the first column and a midpoint of second column are laterally separated by a first distance, the midpoint of the second column and a midpoint of the third column are laterally separated by a second distance, and the midpoint of the third column and a midpoint of the fourth column are laterally separated by a third distance, wherein the first, second, and third distances are equal;

a c-shaped ring formed of silicon positioned in the grooves of the four columns, wherein:
the c-shaped ring is of an oxygen content level equal to or less than 1 parts-per-million-atomic (ppma) and the c-shaped ring is of a diameter greater than 300 mm; and
the c-shaped ring is configured to support a wafer, wherein the wafer is of a wafer diameter equal to or greater than 300 mm, and wherein the wafer is in direct contact with the c-shaped ring,
wherein the top plate is split between the first column and fourth column, wherein a gap in the c-shaped ring is larger than the split in the top plate.

13. The device of claim 12, further comprising a wafer on the c-shaped ring, wherein:
a diameter of the wafer is greater than an inner diameter of the c-shaped ring; and
an outer diameter of the c-shaped ring is greater than the diameter of the wafer.

14. The device of claim 13, wherein:
the outer diameter of the c-shaped ring is greater than 300 mm.

15. The device of claim 12, wherein:
a gap between two terminals of the c-shaped ring is approximately equal to 127.1 mm.

16. The device of claim 12, wherein:
a width of the c-shaped ring is approximately equal to 31 mm.

17. The device of claim 12, wherein:
the oxygen content level of the c-shaped ring is approximately equal to 0.2 ppma.

18. The device of claim 12, further comprising a wafer on the c-shaped ring, wherein:
a diameter of the wafer is equal to or greater than 300 mm.

19. The device of claim 1, wherein the top plate has a top plate gap formed therein, wherein the top plate gap is positioned between the first column and the fourth column and aligned with the first gap of the supporting structure.

20. The device of claim 19, wherein the first gap of the supporting structure is wider than the top plate gap.

* * * * *